United States Patent
Ogura et al.

(10) Patent No.: US 6,184,625 B1
(45) Date of Patent: Feb. 6, 2001

(54) ION BEAM PROCESSING APPARATUS FOR PROCESSING WORK PIECE WITH ION BEAM BEING NEUTRALIZED UNIFORMLY

(75) Inventors: Satoshi Ogura; Shotaro Ooishi; Isao Hashimoto; Satoshi Ichimura, all of Hitachi (JP)

(73) Assignee: Hitachi, Ltd., Tokyo (JP)

( * ) Notice: Under 35 U.S.C. 154(b), the term of this patent shall be extended for 0 days.

(21) Appl. No.: 09/327,502

(22) Filed: Jun. 8, 1999

(30) Foreign Application Priority Data

Jun. 9, 1998 (JP) .................................................. 10-160271

(51) Int. Cl.$^7$ ................................ H01J 7/24; H05B 31/26
(52) U.S. Cl. ............... 315/111.81; 250/251; 250/492.21; 118/723 MW; 118/723 ME; 156/345
(58) Field of Search ............................... 250/251, 492.21; 315/111.21, 111.81; 118/723 MW, 723 ME, 723 IR; 156/345

(56) References Cited

U.S. PATENT DOCUMENTS 5,750,987 * 5/1998 Ichimura et al. .................... 250/251

FOREIGN PATENT DOCUMENTS 63-157887 6/1988 (JP) .
8-296069 11/1996 (JP) .

* cited by examiner

Primary Examiner—Michael B Shingleton
(74) Attorney, Agent, or Firm—Mattingly, Stanger & Malur, P.C.

(57) ABSTRACT

In order to uniformly neutralize a large current and a large diameter ion beam so as to irradiate an ion beam having a reduced beam divergence on a process target, an ion beam processing apparatus comprises an ion source for producing a processing plasma, a processing chamber as a vacuum chamber for accommodating a process target, an extract electrode for extracting an ion beam so as to irradiate on said process target, an annular electrode disposed in said processing chamber for forming an annular magnetic field therein, through which said ion beam is irradiated on said process, and a wave guide for introducing microwave through an opening provided on a wall forming said processing chamber, into said annular magnetic field.

9 Claims, 6 Drawing Sheets

ION BEAM PROCESSING APPARATUS FOR PROCESSING WORK PIECE WITH ION BEAM BEING NEUTRALIZED UNIFORMLY

BACKGROUND OF THE INVENTION

The present invention is related to an ion beam processing apparatus, and in particular, to an ion beam processing apparatus which is suitable for processing a work piece by etching with a large current and a large diameter ion beam.

As a prior art ion beam processing apparatus, there is known, for example, an etching apparatus for etching a work piece using an ion beam as disclosed in JPA Laid-Open No. 63-157887. In this apparatus, in order to prevent for the work piece charged by the ion beam irradiated thereon from being damaged due to its charging, an ion beam neutralizing method is employed, wherein a plasma is generated by a microwave discharge in a neutralizing unit disposed near to the ion beam, and electrons are supplied from the plasma through a small opening to the ion beam so as to neutralize the ion beam. This method assures a longer time of operation compared to an ion beam neutralizing method which uses a hollow cathode containing a filament for emitting thermoelectrons, and thus is suitable for neutralizing a reactive ion beam. Further, because no filament such as tungsten is used, contamination of the work piece by heavy metals constituting the filament can be prevented, thereby providing for a clean ion beam processing.

However, the conventional neutralizing method has a limitation in providing for a large current and large diameter ion beam because of the following reasons to be described below.

When providing for a large current ion beam, it becomes necessary also to increase a flow of electrons to be supplied from the neutralizing unit in order to effectively neutralize the large current ion beam thus increased. However, according to the conventional method whereby electrons are supplied from the plasma produced within the neutralizing unit, a same quantity of ion current as an increase in the large current ion beam must be collected within the neutralizing unit. That is, an increase in the flow of electrons to be supplied means that the ion current to be collected also increases. In addition, in order for a higher density plasma to be generated within the neutralizing unit, it becomes necessary to increase the power of a microwave to be input into the neutralizing unit, consequently increasing a plasma potential in the neutralizing unit. This means an increase in collision energy of ions to be collected in the neutralizing unit. According to the conventional method as described above, with increases in the ion current colliding on the internal wall of the neutralizing unit and in the ion energy, conducting particles sputtered from the internal wall of the neutralizing unit by ion bombardment are caused easily to deposit on a microwave inlet window of the neutralizing unit, thereby substantially limiting a service life of the neutralizing unit.

Further, in order to extract a large quantity of electrons into the processing chamber, it becomes necessary to decrease a potential of the neutralizing device itself to a negative potential which is far below compared to that of the processing chamber. Consequently, the energy of electrons having been extracted from the neutralizing device becomes greater, thereby distorting a distribution of potentials in the ion beam, and thereby causing to diverge the ion beam which inherently must be parallel. Still further, because the site of supply of electrons to the ion beam is localized according to the conventional method, its spatial uniformity effect of neutralization is deteriorated with an increasing diameter of the ion beam.

From the reasons described above, it has been difficult according to the conventional methods to obtain a large current, large diameter ion beam with a minimized divergence, which is in excess of 300 mA and 200 mm in diameter, and which is uniformly neutralized.

Hence, in order to solve these problems, there has been proposed a microwave neutralizing device for use in an ion beam processing apparatus as disclosed in JPA No. 8-296069, which utilizes a multi-cusp magnetic field formed between electron cyclotron resonance magnetic fields, and into which a microwave is introduced through a wave guide to form a plasma therein. This plasma is used as a source of low energy electrons.

SUMMARY OF THE INVENTION

When using the microwave neutralizing device as disclosed in JPA No. 8-296069, it becomes possible to provide an ion beam processing apparatus to uniformly neutralize a large current and a large diameter ion beam so as to irradiate an ion beam having a reduced beam divergence on a process target.

However, in such ion beam processing apparatus, an annular electrode 8 is disposed between a plasma generating chamber 1 and a processing chamber 23 and the processing chamber 23 is connected to the plasma generating chamber 1 through the annular electrode 8.

Therefore, the annular electrode 8 forms a portion of the vacuum chamber providing the vacuum of the vacuum chamber, and needs to be constructed with a thick metal to be strong in order to prevent the vacuum chamber from an atmospheric pressure.

Here, many permanent magnets 9 for forming an annular magnetic field inside of the vacuum chamber are arranged outside of the vacuum chamber.

Therefore, the thick metal of the annular electrode 8 make the annular magnetic field generated by the many permanent magnets 9, difficult sufficiently to be formed inside of the vacuum chamber through the thick metal.

The present invention is provided referring to this problem.

An ion beam processing apparatus in the present invention comprises an ion source for producing a processing plasma, a processing chamber provided as a vacuum chamber for accommodating a process target being disposed adjacent to said ion source, an extract electrode for extracting an ion beam from said processing plasma into the processing chamber so as to irradiate on said process target, an annular electrode disposed in said processing chamber for forming an annular magnetic field therein, through which said ion beam being irradiated on said process, and a wave guide for introducing microwave through an opening provided on a wall forming said processing chamber, into said annular magnetic field.

DETAILED DESCRIPTION OF THE PREFERRED EMBODIMENT

A first preferred embodiment of the invention will be described with reference to the accompanying drawings in the following.

Figure 1:
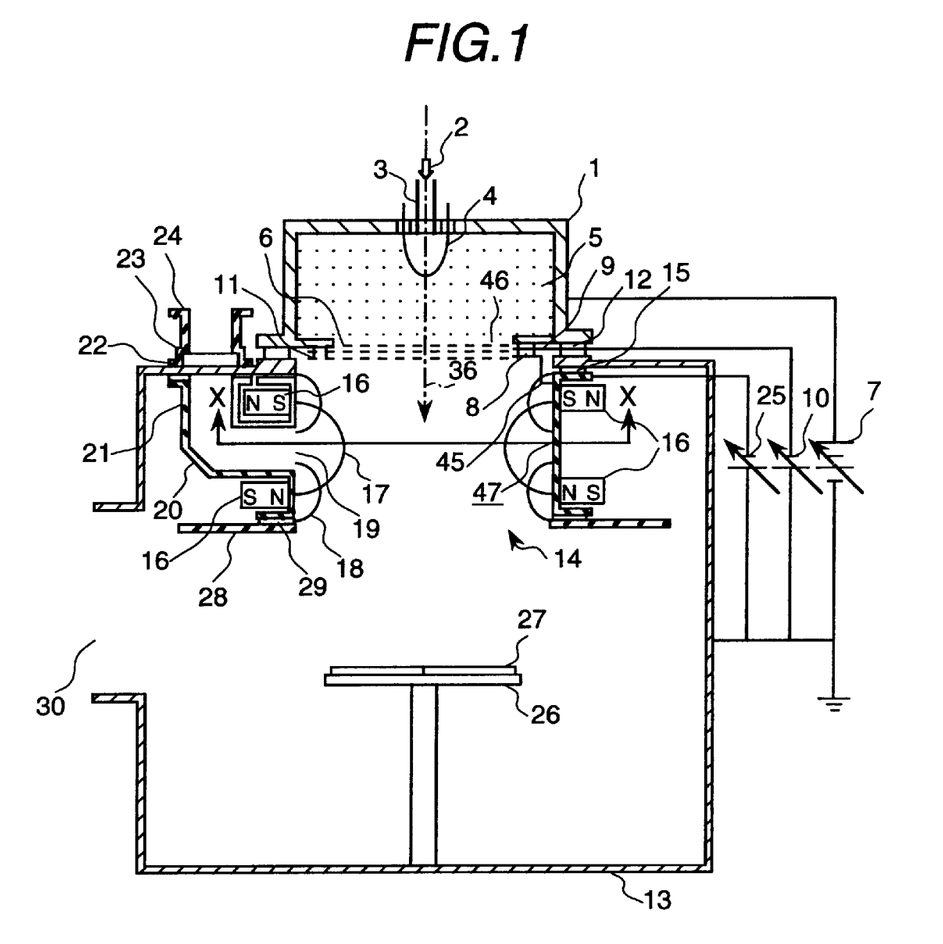
FIG. 1 is a cross-sectional view of an ion beam processing apparatus according to one embodiment of the invention.
Figure 2:
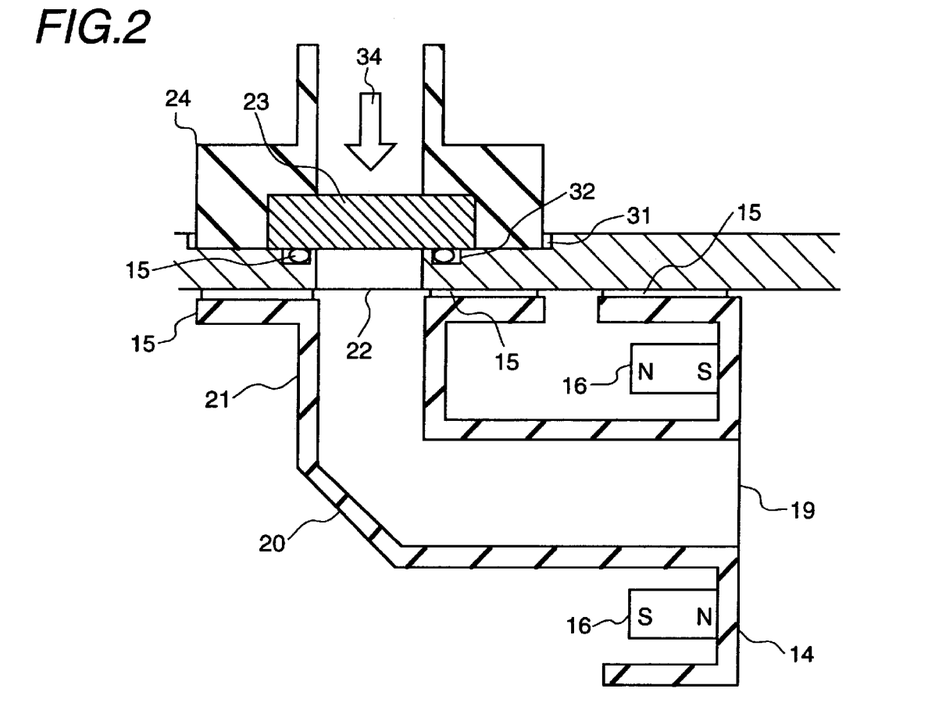
FIG. 2 is a cross-sectional view of a wave-guide for introducing a microwave.

FIG. 1 is a schematic cross-sectional view of an ion beam processing apparatus according to a first embodiment of the invention. FIG. 2 is a schematic cross-sectional view of a main part of a guide wave indicative of its structure for introducing the microwave according to the invention The ion beam processing apparatus of FIGS. 1 and 2 is comprised of ion source 1, acceleration electrode 6, deceleration electrode 9, protection electrode (third electrode) 11, microwave neutralizer 14, and processing chamber 13. The processing chamber 13, which constitutes a vacuum container, is disposed in juxtaposition with the ion source 1, and is connected thereto via insulation spacer 12. Regarding the microwave neutralizer 14, a part of which that does not constitute the vacuum container, is disposed outside the processing chamber 13, and a main part thereof is disposed inside the processing chamber 13.

The ion source 1 which is composed as a container for generating a processing plasma has a plasma gas inlet pipe 3 connected at its upper side, a plasma generation filament 4 disposed therein, and an opening portion 46 formed at its bottom side. Plasma gas 2 which is introduced into the ion source 1 through gas inlet tube 3 is heated by conduction of filament 4 so as to obtain a sufficient energy to become a plasma 5. Acceleration electrode 6 is disposed in the opening portion 46 of the ion source 1 and firmly connected thereto. This acceleration electrode 6 is connected to an acceleration power supply 7 via ion source 1. Both the acceleration electrode 6 and ion source 1 are applied a positive voltage from the acceleration power supply 7. A deceleration electrode 9 is mounted on the acceleration electrode 6 via an electrode insulation spacer 8. The deceleration electrode 9 is supplied with a negative voltage from a deceleration power supply 10. Namely, the acceleration electrode 6 and the deceleration electrode 9 are disposed in juxtaposition with the ion source 1, and are composed as an extraction electrode for extracting a processing ion beam 36 from plasma 5 within the ion source 1 into processing chamber 13 and irradiating the same on a wafer (process target) 27 placed on a holder 26. Protection electrode (third electrode) 11 is mounted on the deceleration electrode 9 via insulation spacer 8, and the protection electrode 11 is further connected to microwave neutralizer 14 via conductor 45. Microwave neutralizer 14 is connected to neutralizing power supply 25. According to this embodiment of the invention, because that a potential of processing chamber 13 is set at the earth potential, a potential of the protection electrode 11 and microwave neutralizer 14 is maintained at a negative potential relative to a potential of the processing chamber 13. Namely, by setting the potential of the protection electrode 11 at a negative potential relative to the potential of processing chamber 13, the ions in the neutralizing plasma generated by the microwave neutralizer 14 are collected by protection electrode 11 before they collide on the deceleration electrode 9, thereby preventing for the deceleration electrode 9 to be damaged by ion bombardment.

The microwave neutralizer 14 of the invention, which functions as the neutralizing plasma generation means and the ion collection means, is comprised of external (atmospheric side) wave guide 24, quartz plate 23, internal (vacuum side) wave guide 21, a plurality of permanent magnets 16, annular electrode 47, and deposition prevention plate 28, and wherein the annular electrode 47 is disposed inside the processing chamber 13 aligned with the center line of ion source 1 and is firmly fixed thereto via insulation spacer 15. The external (atmospheric side) wave guide 24 disposed outside the processing chamber 13 and with interposition of quartz plate (microwave transparent plate) 23 which hermetically seals the opening 22 formed in the processing chamber 13 for introducing the microwave thereinto is firmly fixed on an outer wall of processing chamber 13 as an external portion of the wave guide for guiding microwave 34 generated in a microwave generator (not shown) to the opening 22. A recess portion 31 and O-ring groove 32 are formed on the outer surface of processing chamber 13 and in the vicinity of the opening 22. O-ring 33 is mounted in the O-ring groove 32, and quartz plate 23 is disposed on the O-ring 33. The quartz plate 23 is coupled to the opening 22 as supported by an end portion of the wave-guide 24. The end portion of the wave guide 24 is firmly fixed to the outer wall of processing chamber 13 by means of fixtures such as insulated screws, insulated bolts and the like (not shown). Namely, by connecting firmly the wave guide 24 outside the opening 22 of processing chamber 13 via O-ring 33 and quartz plate 23, vacuum in processing chamber 13 is maintained.

Internal wave guide (on vacuum side) 21 provided for guiding the microwave passing through quartz plate 23 is firmly fixed at its one end to an inner wall of processing chamber 13 via insulation spacer 15, and at the other end thereof coupled to annular electrode 47 formed into a straight tube integral therewith. Further, the wave guide 21 is provided with a deflection portion 20 for reflecting microwave 34 passing through quartz plate 23 toward a direction of annular electrode 47 on its way so as to prevent for high energy conducting particles from depositing on quartz plate 23 which serves as the microwave introduction window.

Annular electrode 47, which is formed approximately into a cylindrical shape as an annular member which surrounds a periphery of a propagation region of processing ion beam 36, is provided with an opening 19 for introducing microwave 34 into a region inside the annular member 47. Further, the annular electrode 47, likewise the protection electrode 11, is connected to neutralizing power supply 27, and the annular electrode 47 is applied with a voltage which is negative relative to that of the processing chamber 13. A pair of permanent magnets 16 having their magnetic poles counterposed is disposed in plural numbers at a predetermined space along an external periphery of annular electrode 47. Namely, arrays of plural permanent magnets (magnetic substances) 16 which constitute the magnetic field forming members of the invention are arranged with their magnetic polarities counterposed along the outer periphery of the annular electrode 47. Each pair of permanent magnets 16 disposed in opposite polarities produces a line of magnetic force 17, and a magnetic field 18 is allowed to be formed, on the internal side of annular electrode 47, having a flux density of electron cyclotron resonance corresponding to a frequency of microwave 34. Magnetic field 18 is allowed to form a multi ring cusp magnetic field as will be described later. Further, annular electrode 47 is connected to a deposition prevention plate 28 via insulation spacer 29.

This deposition prevention plate 28 is provided for preventing a sputter from wafer 27 placed on holder 26 from depositing on microwave neutralizer 14. This deposition prevention plate 28 is maintained at the same potential as that of the processing chamber 13 (which is normally at the earth potential). Further, an exhaust opening 30 is formed in the processing chamber 13 so as to allow for the inside of the processing chamber 13 to be vacuum deaerated as required by an exhaust system connected to the opening 30. By way of example, when connecting respective portions via insulation spacers, electric connection structures using insulation screws or the like are employed.

Figure 3A:
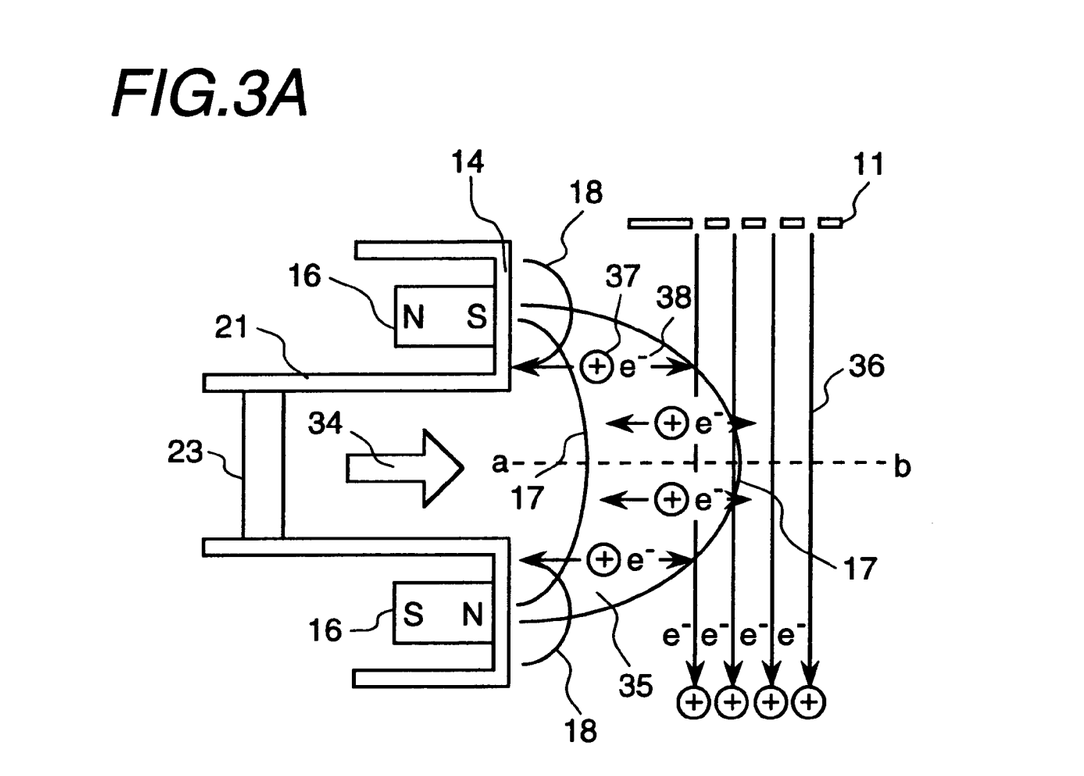
FIG. 3A is a schematic diagram indicating a method of generating a neutralizing plasma according to the invention.
Figure 3B:
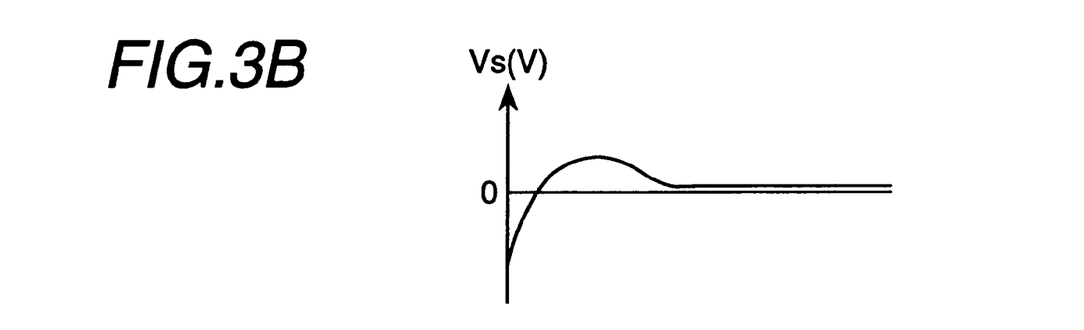
FIG. 3B is a characteristic diagram indicating a distribution of spatial potentials along line a–b.
Figure 4:
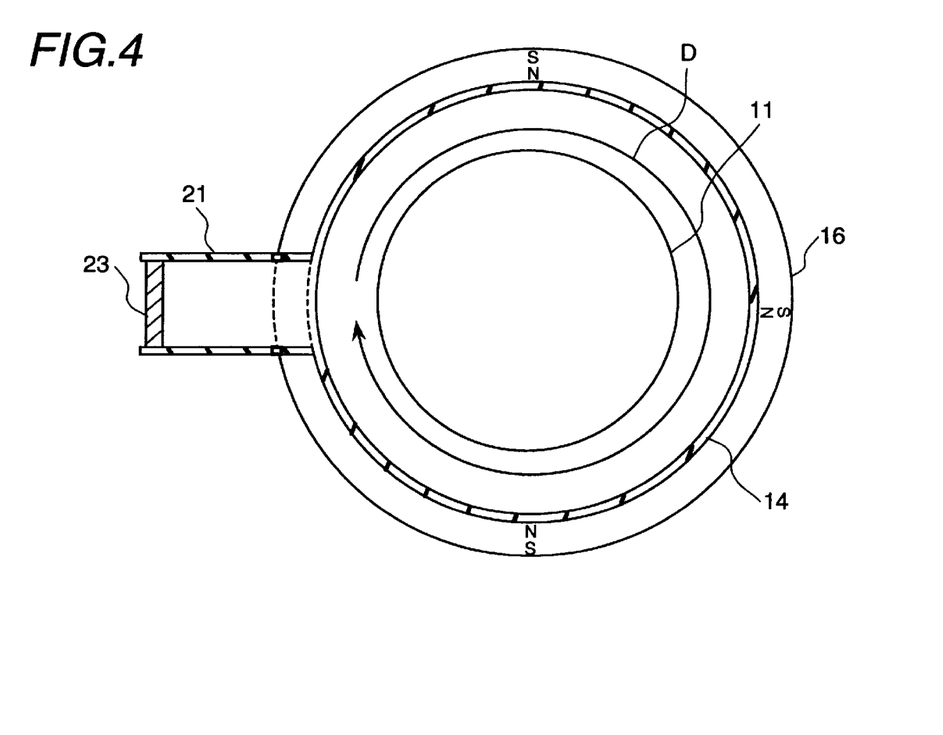
FIG. 4 is a cross-sectional view of the ion beam processing apparatus of FIG. 1, cut out along line X—X.

Now, operation of the ion beam processing apparatus of FIG. 1 will be described in the following with reference to FIGS. 3 and 4. When microwave 34 of 2.45 GHz is introduced from the microwave generator into the atmospheric side wave guide 24, microwave 34 guided through wave guide 24 is allowed to pass through quartz plate 23 to enter vacuum side wave guide 21. When this microwave 34 is reflected on the deflector 20 and is introduced into the inner region of annular electrode 47 through opening 19, this microwave 34 is absorbed by electrons by resonance absorption in the magnetic field 18 with an electron cyclotron resonance flux density of 875 gauss, thereby generating high energy electrons. This high energy electrons move along the line of magnetic force 17 reciprocating in the multi ring cusp magnetic field formed between the juxtaposed magnets and on the inner surface of annular electrode 47. As a macro movement, the high energy electrons revolve in a circumferential direction by a magnetic field grading drift action as indicated in FIG. 4 along annular (band) electrode 47 so as to ionize the gas and generate a neutralizing plasma in an uniform ring shape. Then, a portion of the neutralizing plasma having a good containment of the plasma is represented as a high-density plasma portion 35. This plasma portion 35 is in contact with the annular electrode 47 and the ion beam 36. At this instant, because the neutralizing plasma is generated in front of the opening 18, microwave 34 introduced from the wave guide 21 is deflected outwardly in the directions of electron cyclotron resonance magnetic fields 18 so as to facilitate its arrival thereto, thereby ensuring an efficient absorption of microwave 34.

Still further, when the neutralizing plasma is formed, because that annular electrode 47 is set at the negative potential relative to the potential of processing chamber 13, ions 37 in the neutralizing plasma are captured by the annular electrode 47, thereby allowing electrons 38 having a same quantity of opposite charge as that of ions 37 to be supplied uniformly toward the ion beam 36. In addition, because that the protection electrode 11 is maintained likewise the annular electrode 47 at the negative potential relative to the potential of processing chamber 13, it becomes possible to reduce a probability of direct collision of the ions 37 of the neutralizing plasma with deceleration electrode 9, to increase an efficiency of capture of ions 37 from the neutralizing plasma, and improve a quantity of supply of electrons 38 into ion beam 36 as well. By way of example, even if the potential of protection electrode 11 is set at the same potential as that of processing chamber 13, the probability of direct collision by ions 37 of the neutralizing plasma on the deceleration electrode 9 can be reduced as well.

In the above-mentioned embodiment of the invention, because that the vacuum side wave guide 21 and annular electrode 47 are disposed inside of the processing chamber 13, no additional machining is required for maintaining wave guide 21 and annular electrode 47 in vacuum, and further because that a thickness of walls of the portions through which the line of magnetic force 17 passes can be made thinner, there is another advantage that a magnetic strength of each permanent magnet can be made relatively smaller. In addition, because that the insulation of wave guide 21 can be provided on the side of the internal wall of processing chamber 13, it is not necessary to provide for an insulation structure for the wave guide exposed to the atmosphere.

Still more, in the above-mentioned embodiment of the invention, because that deflector 20 is provided in the vacuum side wave guide 21 after quartz plate 23 for introducing microwave 34 into processing chamber 13, a sputtering from wafer 27 under etching can be prevented from directly flying toward quart plate 23 to deposit thereon, thereby preventing formation of a film on quartz plate 23 which hinders transmission of microwave 34, and allowing a more prolonged time of operation for ion beam processing.

Although the above-mentioned embodiment of the invention has been described by way of example, which has a single opening 22 for introducing the microwave for generating the neutralizing plasma, it is not limited thereto, and other modifications having a plurality of openings 22 formed in processing chamber 13 can be contemplated within the scope of the invention, wherein each opening connected to each of a plurality of vacuum side wave guides 21 allows for a plurality of microwaves 34 to be introduced therein through the plurality of vacuum side wave guides 21, thereby capable of neutralizing a larger current, broader diameter ion beam 36.

Figure 5:
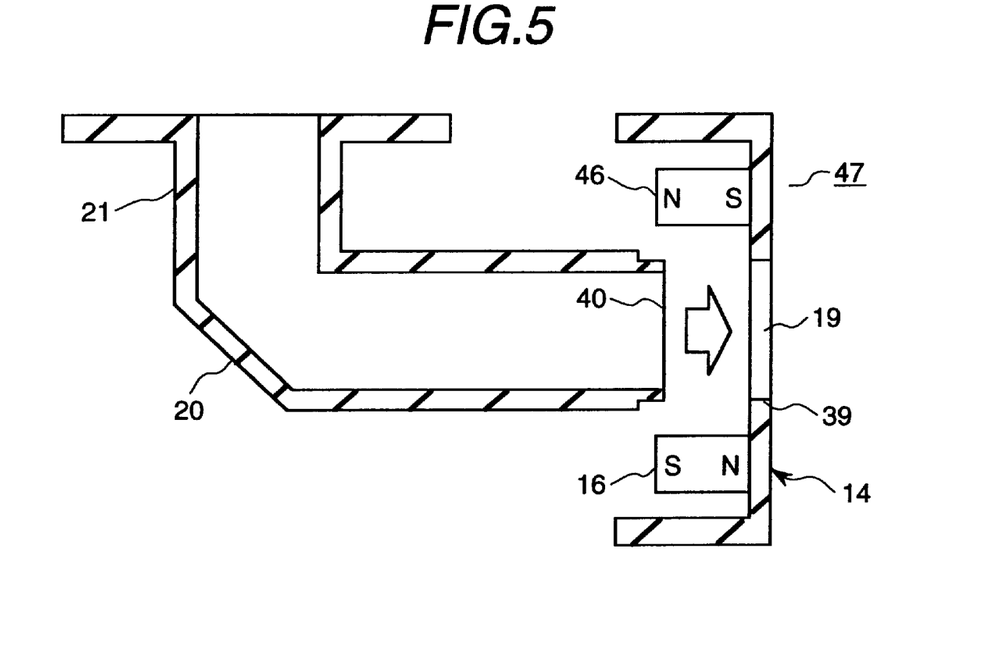
FIG. 5 is a schematic cross-section of a wave-guide according to a second embodiment of the invention.

Although the above-mentioned embodiment of the invention has been described by way of example using an integral assembly of wave guide 21 and annular electrode 47, wherein the wave guide 21 and annular electrode 47 are formed integral, but it is not limited thereto, and other modifications allowing their insert-connection can be contemplated within the scope of the invention wherein one end of wave guide 21 is formed into a straight pipe opening type wave guide 40 which can be inserted into an opening 19 which is formed in annular electrode 47 at its wave guide connection port 39, thereby allowing for a more simplified process of manufacture.

Figure 6:
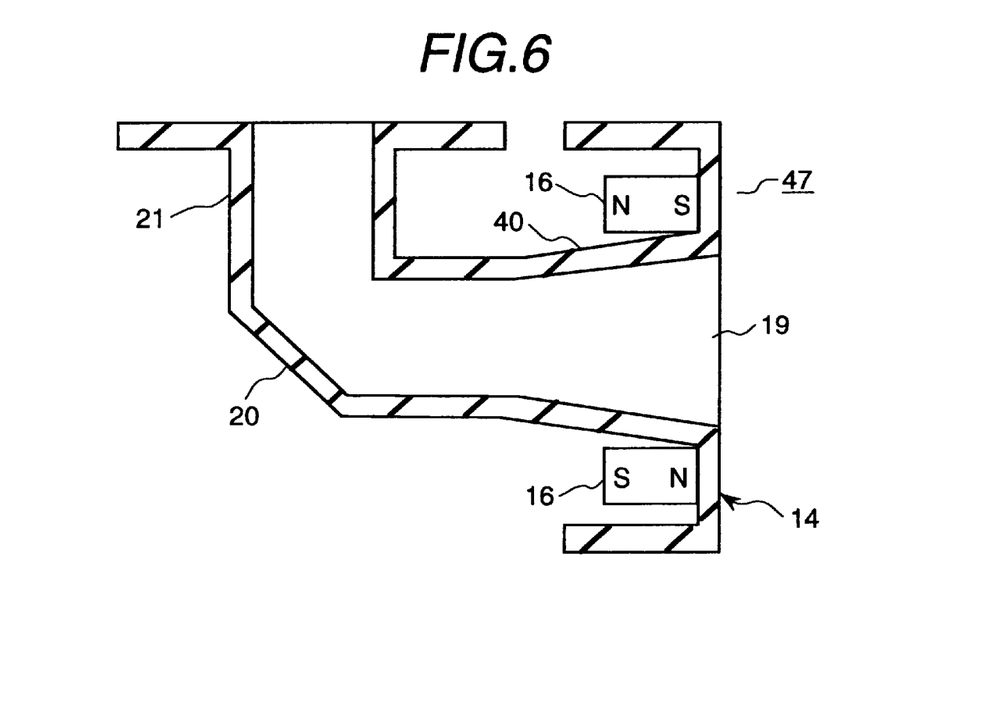
FIG. 6 is a schematic cross-section of a wave-guide according to a third embodiment of the invention.

With reference to FIG. 6, as for the structure of waveguide 21, one end of wave-guide 21 can be formed into a tapered opening type wave-guide 41, which can be connected integral with annular electrode 41.

When the wave guide 21 having tapered opening type wave guide 41 at its one end is provided, because its microwave is caused to propagate in wider radial directions, it becomes possible to irradiate microwave 34 more efficiently into electron cyclotron resonance magnetic field 18, ensuring for microwave 34 to reach the electron cyclotron resonance magnetic field 18 more easily.

Figure 7:
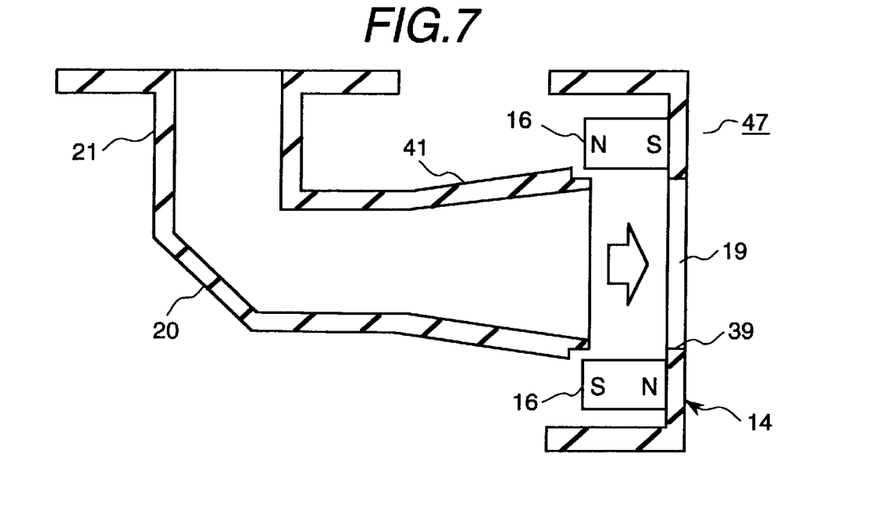
FIG. 7 is a schematic cross-section of a wave-guide according to a fourth embodiment of the invention.

With reference to FIG. 7, another structure of wave guide 21 allowing for an insertion fit-in connection method can be provided wherein one end of wave guide 21 is formed into a tapered opening type wave guide 41, which can be inserted into the opening 19 for connection therebetween.

Figure 8:
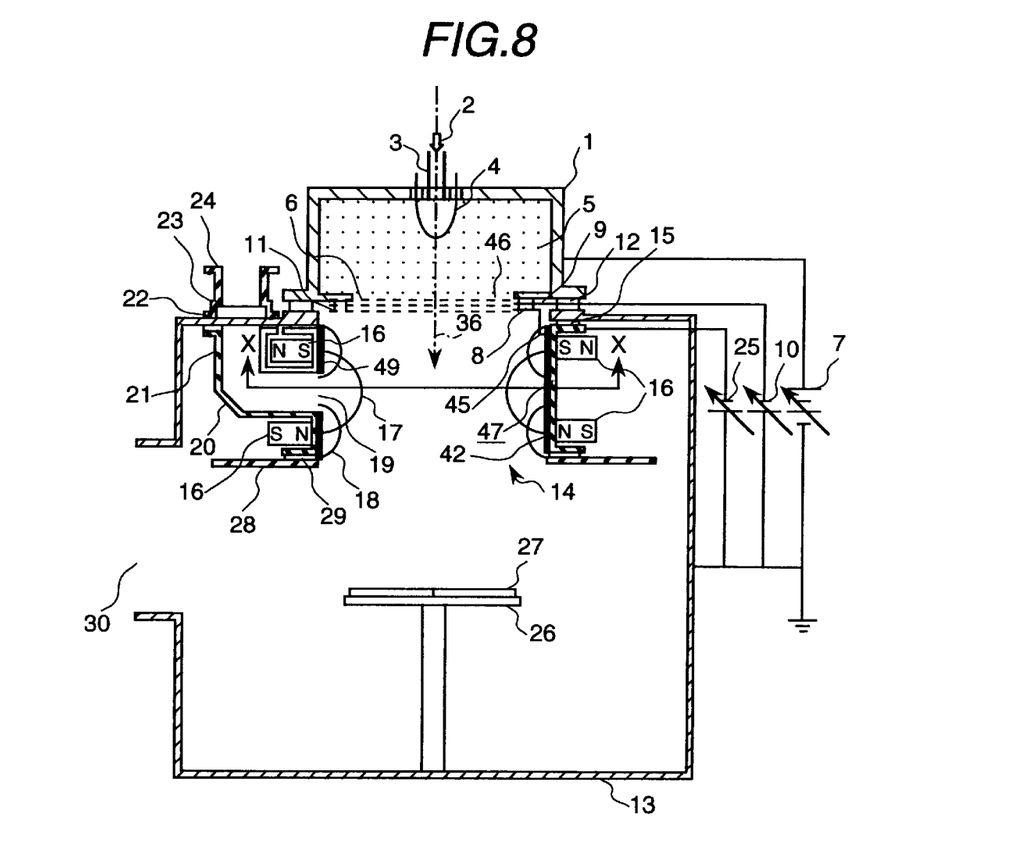
FIG. 8 is a cross-section of an ion beam processing apparatus according to a second embodiment of the invention.

A schematic block diagram indicating a second embodiment of the invention is shown in FIG. 8. A feature of the second embodiment of the invention different from the preceding embodiment resides in that although the negative voltage is applied to annular electrode 47 by connecting the same to neutralizing power supply 25 in the preceding embodiment, its negative voltage is applied from neutralizing power supply 25 to a band electrode 43 which is fixed via electrode insulation spacer 42 on the internal side of annular electrode 47, and through opening 48 formed in annular electrode 47 for internal connection therebetween. Other elements for construction thereof are the same as those in the preceding embodiment of the invention of FIG. 1.

The band electrode 43 provided as a second annular electrode is formed into a cylindrical shape, and allows microwave 34 to be introduced through opening 49. The same is further connected to protection electrode 11 via conductor 45.

According to the second embodiment of the invention, because that its neutralizing plasma can be generated in a region which is inside of band electrode 43, the same effect as the preceding embodiment of the invention can be achieved, and because that annular electrode 47 as well as wave guide 21 can be maintained at the same potential as that of processing chamber 13, wave guide 21 and annular electrode 47 can be coupled firmly with processing chamber 13 without use of insulation spacer 15 and deposition prevention plate insulation spacer 29, thereby eliminating use of insulation structure screws for these spacers.

Figure 9A:
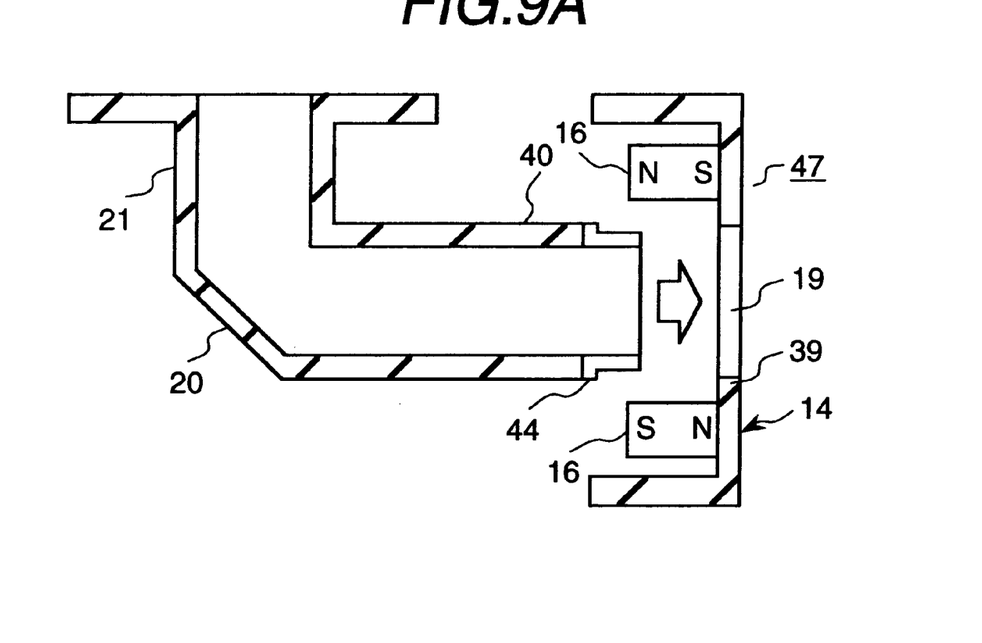
FIG. 9A is a cross-section of a wave guide according to a fifth embodiment of the invention.
Figure 9B:
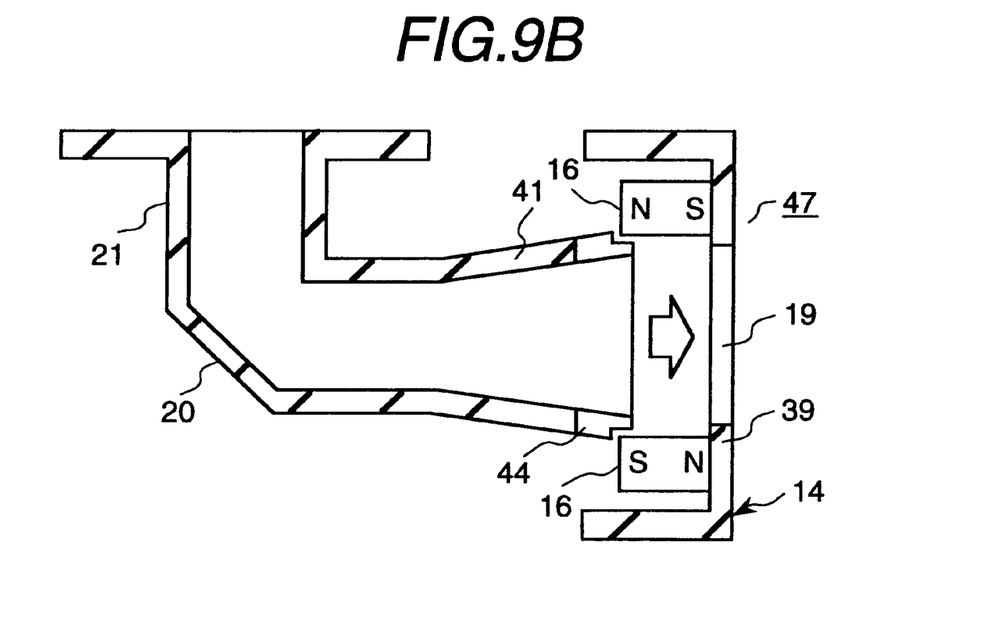
FIG. 9B is a cross-section of a wave-guide according to a sixth embodiment of the invention.

Further, according to the second embodiment of the invention, wave guide 21 can be formed integral with annular electrode 47, otherwise as indicated in FIG. 9(a) the one end of wave guide 21 can be formed into tapered opening type wave guide 41 having spacer 44 mounted on its end, which can be inserted into opening 19. Alternatively, as indicated in FIG. 9(b), one end of wave guide 21 can be formed into a straight tube opening type wave guide 40 having spacer 44 mounted to this end, which can be inserted into opening 19 for connection therebetween.

Further, according to this method whereby insulation spacer 44 is mounted on the end of wave guide 40, 41, the provision of insulation spacer 15 is not required for connection of wave guide 21 to processing chamber 13, thereby eliminating the use of the insulation construction screws corresponding to these spacers.

The aforementioned embodiments 1 and 2 have been described by way of examples in which annular electrode 47 and protection electrode 11 are connected via conductor 45, or in which band electrode 43 is connected to protection electrode 11 via conductor 45, however, it is not limited thereto, and another modification within the scope of the invention can be adopted in which protection electrode 11 is connected to a power supply having the same potential as the potential of processing chamber 13, instead of its connection to neutralizing power supply 25.

What is claimed is:

1. An ion beam processing apparatus comprising
   an ion source for producing a processing plasma,
   a processing chamber provided as a vacuum chamber for accommodating a process target being disposed adjacent to said ion source,
   an extract electrode for extracting an ion beam from said processing plasma into the processing chamber so as to irradiate on said process target,
   an annular electrode disposed in said processing chamber for forming an annular magnetic field therein, through which said ion beam being irradiated on said process, and
   a wave guide for introducing microwave through an opening provided on a wall forming said processing chamber, into said annular magnetic field.

2. An ion beam processing apparatus as defined in claim 1, said ion beam processing apparatus further comprising
   a micro wave transparent plate being provided on said opening so as to cover said opening and to transmit said microwave.

3. An ion beam processing apparatus as defined in claim 2, wherein
   said micro wave transparent plate is capable of being replaced from outside of said processing chamber.

4. An ion beam processing apparatus as defined in claim 1, wherein
   said wave guide is partially bent.

5. An ion beam processing apparatus as defined in claim 4, wherein
   said microwave is deflected in a portion of said wave guide which is bent so as to be transmitted into said annular magnetic field.

6. An ion beam processing apparatus as defined in claim 1, said ion beam processing apparatus further comprising
   plurality of openings being provided on said wall, and
   plurality of wave guides for introducing microwave respectively through said openings into said annular magnetic field.

7. An ion beam processing apparatus as defined in claim 1, wherein
   an end of said wave guide is inserted so as to fit into an opening provided on said annular electrode.

8. An ion beam processing apparatus as defined in claim 1, wherein
   an end of said wave guide which is connected to said annular electrode, being formed to be a tapered opening type.

9. An ion beam processing apparatus as defined in claim 1, wherein
   said annular magnetic field is formed as a multi ring cusp magnetic field generated by a line of plural magnets.

* * * * *